United States Patent [19]

Kita et al.

[11] Patent Number: 5,126,655
[45] Date of Patent: Jun. 30, 1992

[54] APPARATUS FOR OBSERVING A SUPERCONDUCTIVE PHENOMENON IN A SUPERCONDUCTOR

[75] Inventors: Ryusuke Kita, Chiba; Hidetaka Shintaku; Shuhei Tsuchimoto, both of Nara; Shoei Kataoka, Tokyo; Eizo Ohno; Masaya Nagata, both of Nara, all of Japan

[73] Assignee: Sharp Kabushiki Kaisha, Osaka, Japan

[21] Appl. No.: 598,959

[22] Filed: Oct. 17, 1990

Related U.S. Application Data

[62] Division of Ser. No. 416,486, Oct. 3, 1989.

[30] Foreign Application Priority Data

Oct. 4, 1988 [JP] Japan .................................. 63-250289
Oct. 5, 1988 [JP] Japan .................................. 63-252782

[51] Int. Cl.$^5$ ............................................. G01N 27/00
[52] U.S. Cl. ................................... 324/71.6; 505/842; 505/843; 361/19
[58] Field of Search .............. 324/248, 71.6; 361/19; 505/842, 843, 888, 894

[56] References Cited

U.S. PATENT DOCUMENTS

| 3,620,033 | 11/1971 | Elsner et al. | 505/888 |
|---|---|---|---|
| 4,140,621 | 2/1979 | Nomura et al. | 361/19 |
| 4,486,800 | 12/1984 | Franksen | 361/19 |
| 4,827,217 | 5/1989 | Paulson | 324/248 |
| 4,906,607 | 3/1990 | Deu Tyagi | 324/248 |
| 4,931,732 | 6/1990 | Moon | 505/843 |
| 4,939,458 | 7/1990 | Yarar et al. | 505/842 |
| 4,994,932 | 2/1991 | Okamoto et al. | 361/19 |

FOREIGN PATENT DOCUMENTS

| 286732 | 1/1989 | Japan | 361/19 |
|---|---|---|---|
| 49988 | 2/1989 | Japan | 324/248 |
| 59169 | 3/1989 | Japan | 324/71.6 |
| 185130 | 7/1989 | Japan | 361/19 |
| 2867291 | 11/1989 | Japan | 361/19 |

OTHER PUBLICATIONS

Ishizuka et al. Japanese Journal of Applied Physics vol. 19, No. 4, Apr. 1980, pp. 639-646.

Primary Examiner—Kenneth A. Wieder
Assistant Examiner—Maura K. Regan

[57] ABSTRACT

An apparatus for observing a superconductive phenomenon is disclosed. In the apparatus, a cooling unit cools a superconductor having a threshold temperature at which the superconductor changes from the normal conductive phase to the superconductive phase, and a magnetic field is applied thereto. A current is supplied to the superconductor, and there are clearly observed a phenomenon on which an electric resistance thereof becomes zero at a threshold temperature thereof, a phenomenon on which the superconductor changes from the normal conductive phase to the superconductive phase at a threshold current to be supplied thereto, and a phenomenon on which the super conductor changes from the normal conductive phase to the superconductive phase at a threshold magnetic field to be applied thereto.

7 Claims, 10 Drawing Sheets

APPARATUS FOR OBSERVING A SUPERCONDUCTIVE PHENOMENON IN A SUPERCONDUCTOR

This application is a divisional of copending application Ser. No. 07/416,486, filed on Oct. 3, 1989.

BACKGROUND OF THE INVENTION

1. FIELD OF THE INVENTION

The present invention relates to an apparatus for observing a superconductive phenomenon caused in a superconductor.

2. DESCRIPTION OF RELATED ART

In order to observe a superconductive phenomenon caused in a superconductor such as a phenomenon on which an electric resistance of a superconductor becomes zero at a threshold temperature Tc or less, conventionally, there have been used a cryopump or cryostat for cooling the superconductor, a current power source for supplying a constant direct current to the superconductor, and a voltmeter for measuring an extremely small voltage generated therein.

Further, in order to measure the electric resistance of the superconductor when a magnetic field is applied to the superconductor, there have been used a current power source for supplying a direct current to a coil for applying a magnetic field to the superconductor, and a current controller for varying the current to be supplied to the coil so as to vary the magnetic field intensity thereof in addition to the above-mentioned apparatus. Furthermore, in order to control the current power source, the voltmeter and the current controller, and to process various kinds of electric signals, these units are connected to a microcomputer through a GPIB interface.

However, in a conventional method for observing the superconductive phenomenon on which the resistance of superconductor becomes zero at the threshold temperature Tc, and in a conventional method for measuring the variation in the electric resistance thereof when a magnetic field is applied thereto, it is necessary to separately provide a large-scaled cooling apparatus, a current power source, a voltmeter and a current controller. Furthermore, in order to control these apparatuses and to process various kinds of electric signals, it is necessary to connect these apparatuses to the microcomputer through the GPIB interface. Therefore, in the conventional method for observing the superconductive phenomenon with use of a number of apparatuses, the whole system becomes expensive, and it is difficult to use the above system, for example, for teaching the superconductive phenomenon.

Furthermore, there is provided an apparatus for observing the Meissner effect wherein a superconductor having been cooled at the temperature of the liquid nitrogen is floated above a permanent magnet for a short time.

However, since the apparatus for observing the Meissner effect which is comprised of a cooling apparatus such as the cryostat and a magnetic coil becomes large-scaled, it is difficult for ordinary people to observe the above superconductive phenomenon such as the Meissner effect easily.

Furthermore, in order to observe the superconductive phenomenon, there has been used a method for immersing the superconductive device, on which a pair of current electrodes and a pair of voltage electrodes are formed, in a coolant such as liquid nitrogen. In this method, since the temperature of the superconductive device decreases steeply, the variation in the electric resistance thereof can not be measured at respective temperatures in the range from a room temperature to the threshold temperature Tc. Also, since it is difficult to keep a thermal equilibrium state of the superconductive device, the temperature thereof can not be measured accurately.

Further, in the above-mentioned apparatus for observing the Meissner effect, since the temperature of the superconductor increases for a short time, it is impossible to keep the floatation of the superconductor caused by the Meissner effect for a long time. Furthermore, when frost adheres to the superconductor and a container for containing the superconductor upon observing the superconductive phenomenon, the light transmittance of the container decreases, resulting in that the superconductive phenomenon can not be observed clearly.

SUMMARY OF THE INVENTION

An essential object of the present invention is to provide an apparatus for observing a superconductive phenomenon in a superconductor, which is inexpensive and has a simple structure.

Another object of the present invention is to provide an apparatus capable of simply observing a superconductive phenomenon in a superconductor.

A further object of the present invention is to provide an apparatus having a simple structure and capable of accurately measuring a superconductive characteristic of a superconductor.

A still further object of the present invention is to provide an apparatus capable of clearly observing the Meissner effect in a superconductor for a long time.

In order to accomplish these objects, according to the present invention, there is provided an apparatus for observing a superconductive phenomenon, comprising: a superconductor; means for cooling said superconductor so as to keep the temperature thereof at the threshold temperature or less; means for applying a predetermined magnetic field to said superconductor; means for supplying a predetermined current to said superconductor; and means for observing a phenomenon on which the electric resistance of said superconductor becomes zero at a threshold temperature of said superconductor, a phenomenon on which said superconductor changes from the normal conductive phase to the superconductive phase at a threshold current to be supplied to said superconductor, and a phenomenon on which said superconductor changes from the normal conductive phase to the superconductive phase at a threshold magnetic field to be applied to said superconductor.

According to another aspect of the present invention, there is provided an apparatus for observing a superconductive phenomenon, comprising: a superconductor having a threshold temperature at which said superconductor changes from the normal conductive phase to the superconductive phase so that the electric resistance thereof becomes zero; a current power source for supplying either a constant predetermined direct current or an alternating current to said superconductor in response to a signal; a voltage amplifier for amplifying a voltage generated in said superconductor at a variable voltage gain; means for applying a predetermined magnetic field to said superconductor in response to an analogue signal; means for cooling said superconductor at the threshold temperature thereof or less; a thermal sensor for measuring the temperature of said superconductor, said thermal sensor arranged in the vicinity of said superconductor; an analogue to digital converter for converting an analogue voltage signal into a digital signal; a first digital to analogue converter for converting a digital signal corresponding to a constant direct current to be supplied to said superconductor into an analogue signal and outputting it to said current power source; a second digital to analogue converter for converting a digital signal corresponding to a magnetic field to be applied to said superconductor into an analogue signal and outputting it to said means for applying the magnetic field thereto; an oscillator for generating an alternating-current signal and outputting it to said current power source so as to supply an alternating current to said superconductor; a first switch for switching over between a first state that the analogue signal outputted from said digital to analogue converter is input to said current power source and a second state that the alternating-current signal outputted from said oscillator is input thereto; a capacitor for rejecting a direct-current voltage component contained in the voltage generated in said superconductor and outputting only an alternating-current voltage component thereof; an AC to DC voltage converter for converting the alternating-current voltage component outputted from said capacitor into a direct-current voltage; a second switch for switching over between a third state that the direct-current voltage outputted from said AC to DC voltage converter is input to said analogue to digital voltage converter and a fourth state that the voltage signal outputted from said voltage amplifier is input to said analogue to digital converter; a display for displaying a characteristic of said superconductor; and a microprocessor for controlling the voltage gain of said voltage amplifier and the magnetic field to be applied to said superconductor, for processing electric signals input from said thermal sensor and said analogue to digital converter and for displaying a characteristic of said superconductor on said display.

According to a further aspect of the present invention, there is provided an apparatus for observing a superconductive phenomenon, comprising: a first transparent container for containing a superconductor and a coolant for cooling said superconductor; a second transparent container for containing said first transparent container in such an airtight state that a dried inactive gas flowed thereto is kept at a pressure higher than the pressure of the outside thereof; and heat-insulating means for heat-insulating said first transparent container from the outside of said second transparent container, said heat-insulating means being arranged between said first and second transparent containers.

BRIEF DESCRIPTION OF THE DRAWINGS

These and other objects and features of the present invention will become clear from the following description taken in conjunction with the preferred embodiments thereof with reference to the accompanying drawings, in which.

DETAILED DESCRIPTION OF THE PREFERRED EMBODIMENTS

Preferred embodiments according to the present invention will be described below in detail with reference to the attached drawings.

FIRST PREFERRED EMBODIMENT

Figure 1:
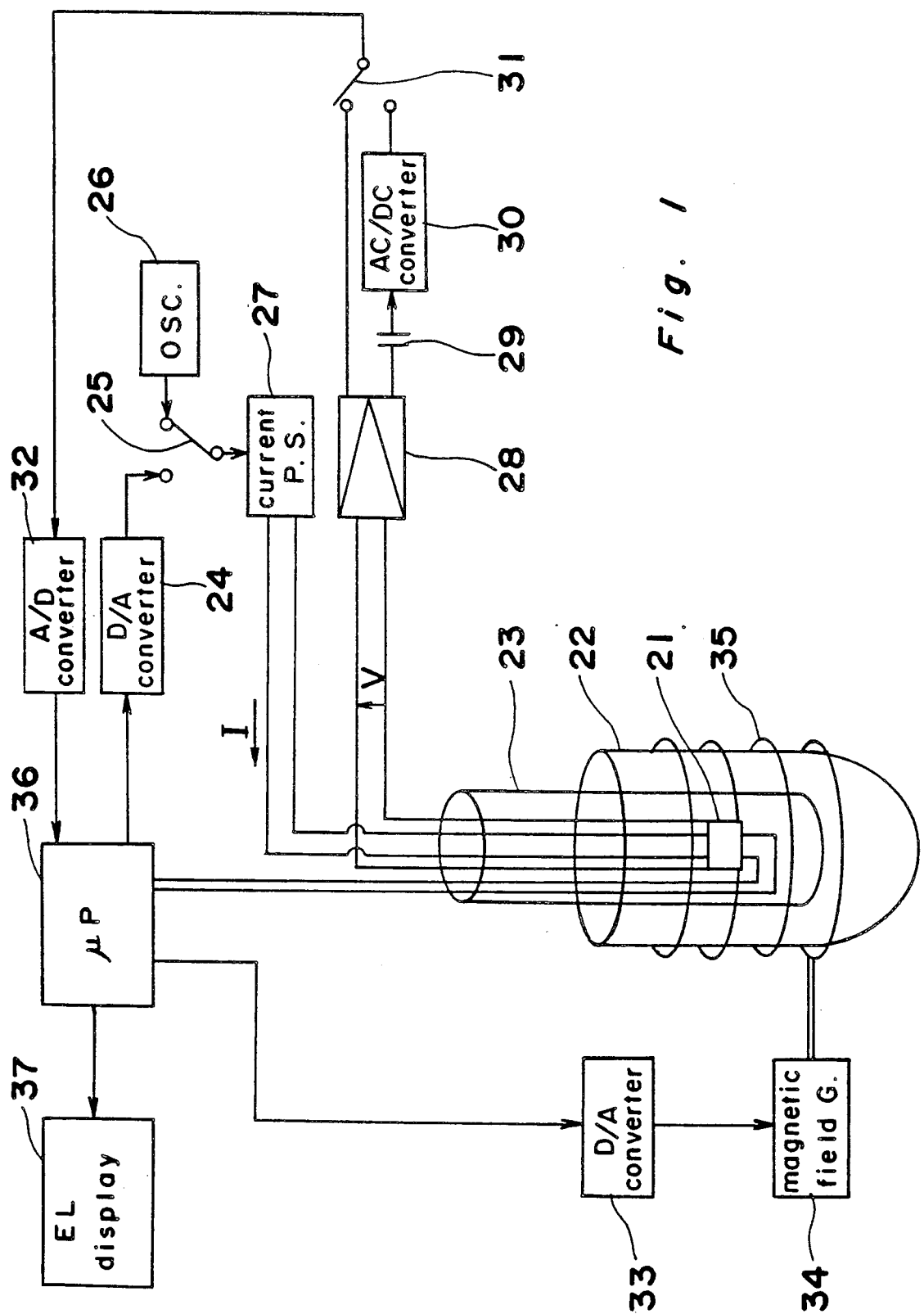
FIG. 1 is a schematic block diagram showing an apparatus for observing a superconductive phenomenon in a superconductor of a first preferred embodiment according to the present invention.

FIG. 1 shows an apparatus for observing a superconductive phenomenon in a superconductor of a sintered body of an oxide of a first preferred embodiment according to the present invention, and FIGS. 2a to 2f show a process for making a sample of a superconductive device comprising the superconductor of the sintered body of the oxide.

This superconductive device is produced as follows.

Figure 2A:
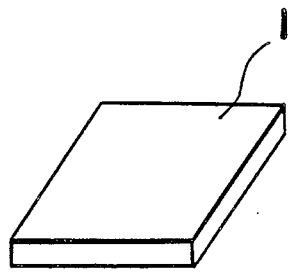
FIGS. 2a to 2c are schematic perspective views showing a process for making a sample of a superconductive device.

Powders of $Y_2O_3$, $BaCO_3$ and $CuO$ are weighed so that a composition ratio of Y, Ba and Cu becomes 1 : 2 : 3. After grinding and mixing these powders in an agate bowl, samples formed with the mixture are calcined at 900° C. for 5 hours in air. Then, the samples are ground and mixed into powder comprised of micro particles having a diameter equal to or smaller than 1 $\mu$ms. Thereafter, the powder is pressed with a press force in the range from 1 to 3.5 tons/cm$^2$ so as to make a rectangular-shaped pellet 1 of one cm square having a thickness in the range from 0.5 mms to 1.0 mm, as shown in FIG. 2a.

Thereafter, this pellet is sintered at 930° C. for 3 hours in air, and then, the temperature thereof is gradually lowered to 500° C. at a lowering speed of about 100° C./hour. After continuing to heat the pellet 1 at 500° C. for one hour, the temperature thereof is gradually lowered to 100° C. at a lowering speed of 100° C./hour so as to form a sintered pellet 1 of a superconductor.

Figure 2B:
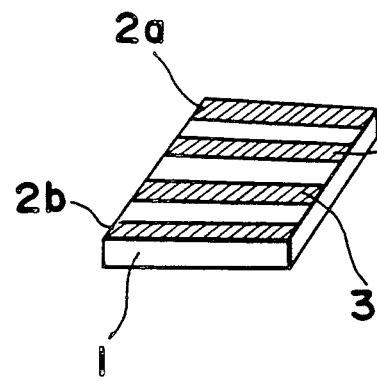
Figure 2C:
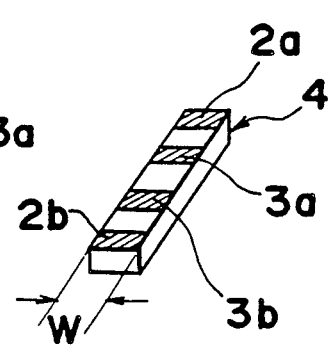

Thereafter, as shown in FIG. 2b, a pair of current electrodes 2a and 2b of Ti and a pair of voltage electrodes 3a and 3b of Ti respectively having a thickness of about 1 $\mu$m are formed on the both end portions of the sintered pellet 1 and the inside portions thereof, respectively, by an electron beam vapor deposition method at such a state that a metal mask pattern is covered on portions of the sintered pellet 1 except for the portions where the electrodes 2a, 2b, 3a and 3b will be formed. Then, the sintered pellet 1 on which the electrodes 2a, 2b, 3a and 3b have been formed is cut into a rod-shaped sample 4 having a width W of 0.7 mms, as shown in FIG. 2c.

Figure 2D:
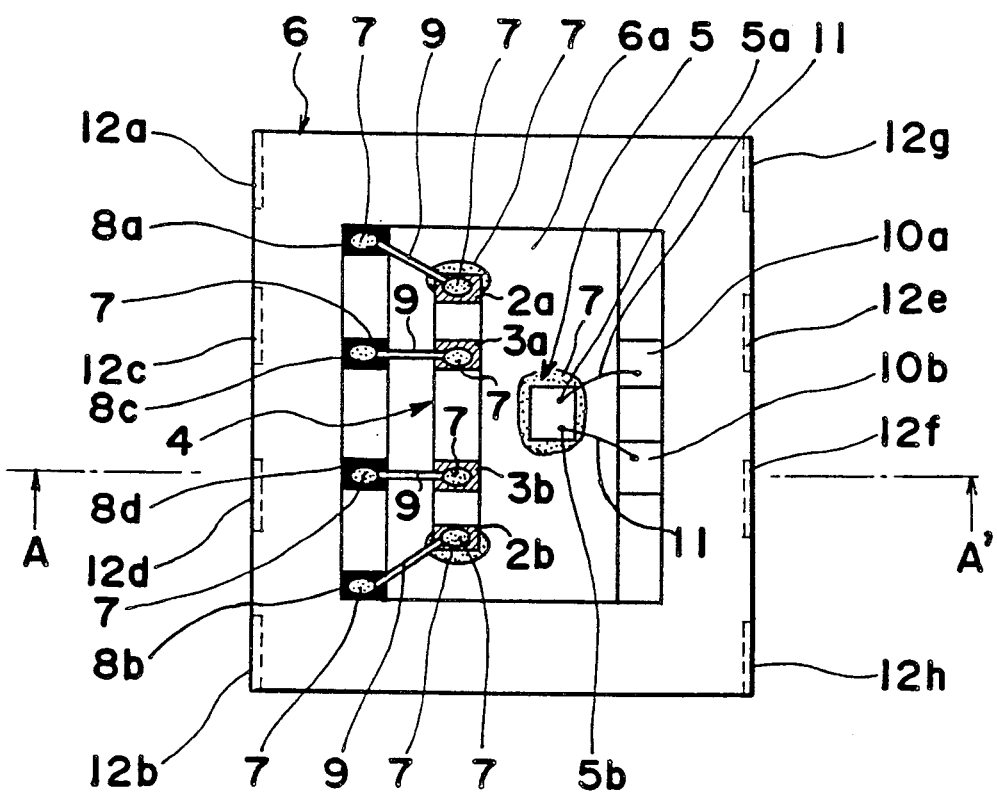
FIG. 2d is a schematic top plan view of the sample shown in FIG. 2c and a platinum film thermometer which are bonded on a DIP type IC package.
Figure 2E:
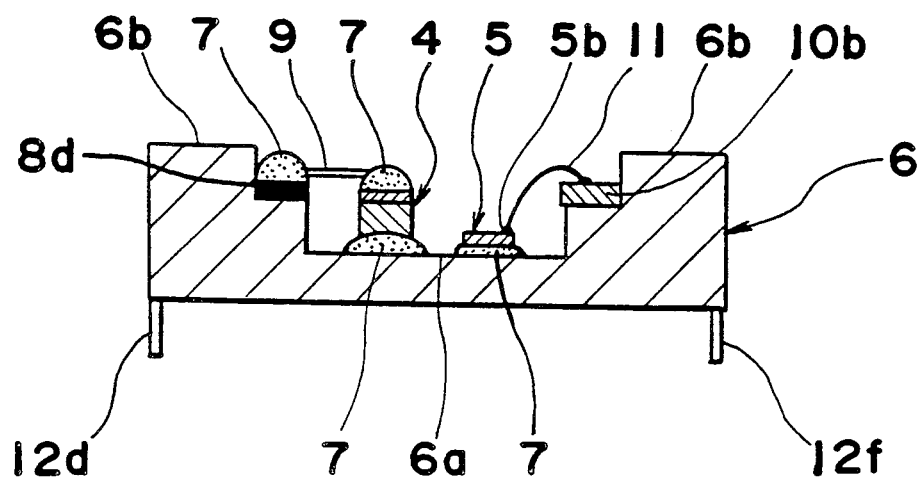
FIG. 2e is a schematic cross sectional view taken on line A—A' of FIG. 3d.

This rod-shaped sample 4 and a platinum film thermometer 5 are bonded on the center platform 6a of a DIP type IC package 6 with use of Ag paste 7 so as to be fixed thereon close to each other, as shown in FIGS. 2d and 2e. It is to be noted that the Ag paste 7 is used in the present preferred embodiment since it has a relatively high thermal conductivity and an excellent bonding force even upon bonding them at a relatively low temperature, and the other sorts of pastes may be used under the condition that it has a relatively high thermal conductively and an excellent bonding force.

Furthermore, internal terminals 8a to 8d formed on the IC package 6 are electrically connected to a pair of current electrodes 2a and 2b and a pair of voltage electrodes 3a and 3b through Cu lead wires 9 bonded thereon with use of Ag paste 7, respectively, and also, electrodes 5a and 5b of the platinum film thermometer 5 are electrically connected to internal terminals 10a and 10b formed on the IC package 6 through Au lead wires 11 by a bonding method. It is to be noted that, in the IC package 6, the internal terminals 8a to 8d, 10a and 10b thereof are electrically connected to external pins 12a to 12f thereof, previously, through Cu connection lines (not shown) formed on IC package 6.

Figure 2F:
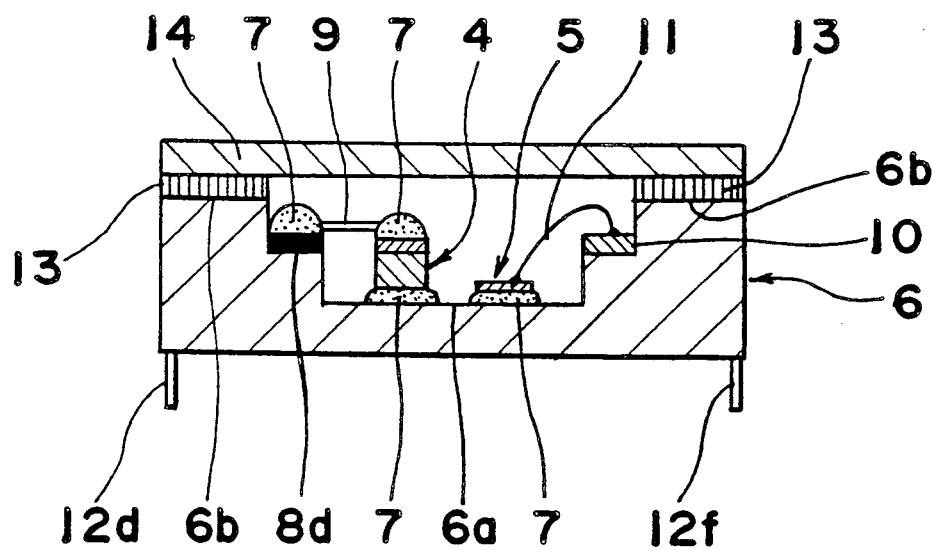
FIG. 2f is a schematic cross sectional view of the packaged sample sealed by a glass plate.

After coating a bonding resin 13 on the edge portion of the bottom surface of a glass plate 14, the glass plate 14 is arranged on the top surface 6b of the IC package 6, and then, the IC package 6 is heated at 110° C. for one hour in nitrogen gas in such a state that the glass plate 14 is pressed onto the top surface 6b of the IC package 6, as shown in FIG. 2f, and sequentially, the IC package 6 is heated at 150° C. for one hour in nitrogen gas so as to seal the IC package 6, resulting in that a packaged sample 21 of a superconductive device is obtained. Finally, the external pins 12a to 12h of the IC package 6 are electrically connected to external circuits through lead wires (not shown) as follows.

Referring to FIG. 1, the packaged sample 21 which has been made as described above is inserted into a glass tube 23, and then, the glass tube 23 is immersed in liquid nitrogen contained in a Dewar flask 22. There is provided a microprocessor 36 for controlling the operation of the apparatus for observing the superconductive phenomenon, and outputting a digital signal regarding a direct current I to be supplied to a pair of current electrodes 2a and 2b of the packaged sample 21, to a digital to analogue converter (referred to as a D/A converter hereinafter) 24. In response to the digital signal, the D/A converter 24 converts it into an analogue signal and outputs the analogue signal to a current power source 27 through a first analogue switch 25. On the other hand, a sinusoidal wave oscillator 26 outputs a sinusoidal wave signal to the current power source 27 through the first analogue switch 25. Therefore, the switch 25 is used for selectively outputting either the analogue signal outputted from the D/A converter 24 or the sinusoidal wave signal outputted from the oscillator 26 to the current power source 27. The current regulated power source 27 which is a current to voltage converter supplies either a direct current or an alternating current I corresponding to the signal which is input thereto, to a pair of current electrodes 2a and 2b of the packaged sample 21.

Figure 3:
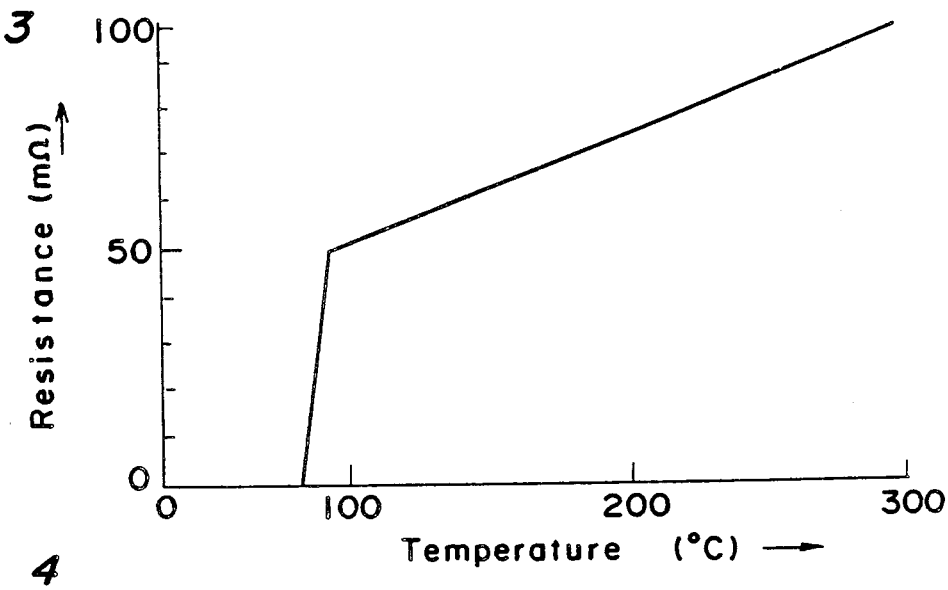
FIG. 3 is a graph showing a temperature characteristic of a resistance of the packaged sample obtained by measurement with use of the observing apparatus shown in FIG. 1.

The temperature of the superconductor of the packaged sample 21 is measured by the platinum film thermometer 5, and a signal regarding the temperature thereof outputted from the thermometer 5 is input to the microprocessor 36. Furthermore, a voltage V outputted from a pair of voltage electrodes 3a and 3b of the packaged sample 21 is applied to a voltage amplifier 28 having a variable voltage gain. The voltage amplifier 28 amplifies the voltage V at a set voltage gain and outputs the amplified voltage to an analogue to digital converter (referred to as an A/D converter hereinafter) 32 through a second analogue switch 31 and to an AC to DC converter 30 through a capacitor 29 having a capacitance of 10 $\mu$F for rejecting a direct-current component superimposed on an alternating-current component of the amplified voltage. The AC to DC converter 30 converts the alternating-current voltage component thereof into a direct-current voltage and outputs it to the A/D converter 32 through the second analogue switch 31. Therefore, the second analogue switch 31 is used for selectively outputting either the amplified voltage outputted from the voltage amplifier 28 or the direct-current voltage outputted from the AC to DC converter 30. Furthermore, the A/D converter 32 converts the voltage which is input thereto through the switch 31 into a digital signal, and outputs it to the microprocessor 36. In response to the digital signal, the microprocessor 36 calculates the resistance of the superconductor of the packaged sample 21 according to a predetermined calculation equation and displays the resistance thereof with the temperature thereof input thereto, on an Electro Luminescense display (referred to as an EL display hereinafter) 37 at real time as shown in FIG. 3.

Figure 4:
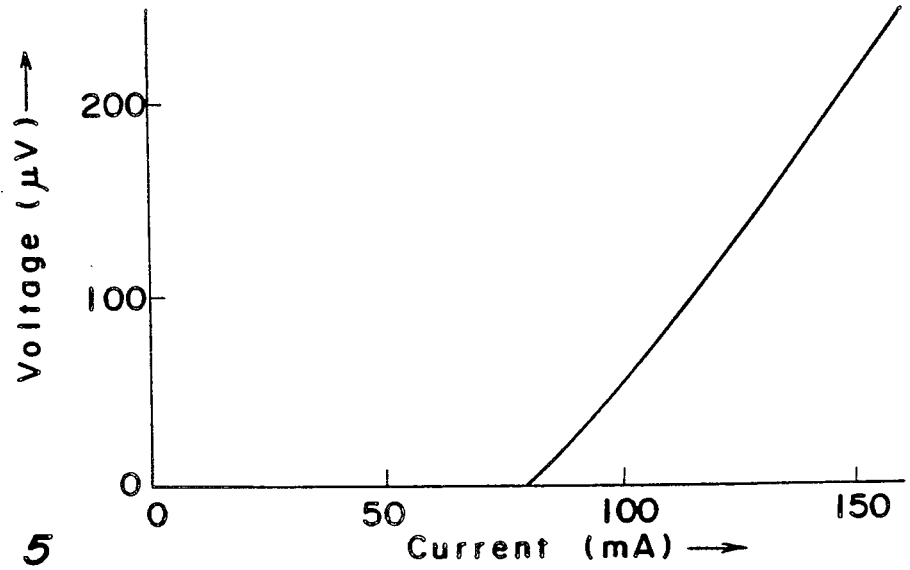
FIG. 4 is a graph showing a current characteristic of a voltage generated in the packaged sample obtained by measurement with use of the observing apparatus shown in FIG. 1.

Furthermore, the microprocessor 36 outputs a digital signal corresponding to a magnetic flux density of a magnetic field to be applied to the packaged sample 21, to a D/A converter 33. The D/A converter 33 converts the digital signal into an analogue direct-current voltage and outputs it to a magnetic field generator 34. The magnetic field generator 34 converts the direct-current voltage into a direct current and supplies it to a coil 35 wound around the Dewar flask 22 so as to apply a magnetic field to the packaged sample 21. Then, in response to the digital signal input from the A/D converter 32, the microprocessor 36 calculates the voltage V generated in the packaged sample 21 according to a predetermined calculation equation, and displays the calculated voltage V with the current I which is supplied to the packaged sample 21 on the EL display 37 at real time as shown in FIG. 4.

Figure 5:
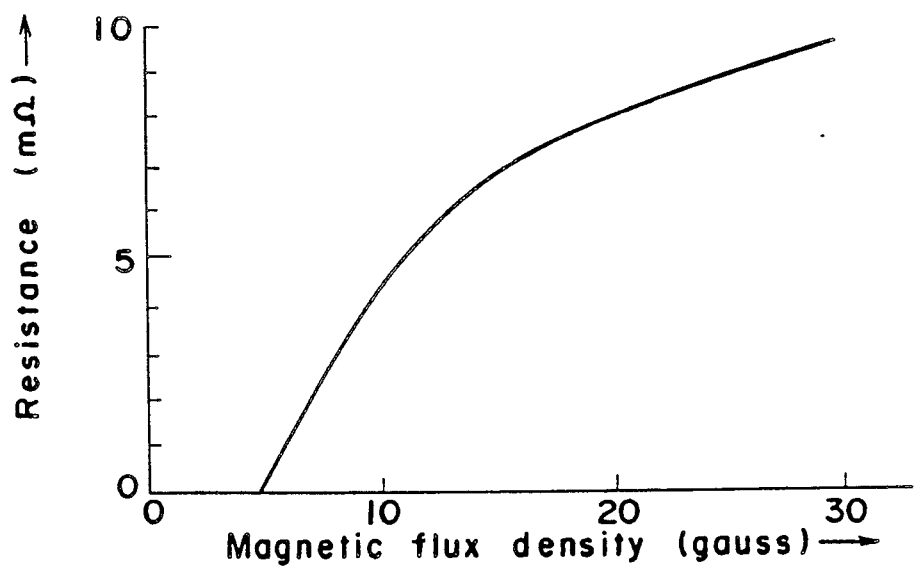
FIG. 5 is a graph showing a magnetic flux density characteristic of a resistance of the packaged sample obtained by measurement with use of the observing apparatus shown in FIG. 1.

Furthermore, in response to the digital signal input from the A/D converter 32, the microprocessor 36 calculates the resistance of the packaged sample 21 according to a predetermined calculation equation, and displays the calculated resistance thereof with the magnetic flux density of the magnetic field applied thereto on the EL display 37 at real time as shown in FIG. 5.

The action of the apparatus for observing the superconductive phenomenon as constructed above upon displaying the following characteristics of the packaged sample 21 on the EL display 37 will be described below.

(1) A temperature characteristic of a resistance of the packaged sample 21.

(2) A current characteristic of a voltage generated therein.

(3) A magnetic flux density characteristic of a resistance thereof.

(1) Action of the apparatus upon measuring a temperature characteristic of a resistance of the packaged sample 21

The action of the apparatus upon measuring a temperature characteristic of a resistance of the packaged sample 21 will be described below with reference to FIG. 1.

First of all, the first analogue switch 25 is switched over so that the sinusoidal signal outputted from the oscillator 26 is input to the current power source 27. In response to the sinusoidal signal, the current power source 27 supplies an alternating current of ±10 mA to the packaged sample 21 which is inserted into the glass tube 23. Thereafter, the glass tube 23 is immersed in the Dewar flask 22. The temperature of the packaged sample 21 is measured by the platinum film thermometer 5 installed in the packaged sample 21, and the signal regarding the temperature thereof outputted from the platinum film thermometer 5 is input to the microprocessor 36. The voltage gain of the voltage amplifier 28 is set at about 5000, and the second analogue switch 31 is switched over so that the signal outputted from the AC to DC converter 30 is input to the A/D converter 32. Then, the voltage generated in the packaged sample 21 varies in the range from +1 mA to −1 mA at a room temperature, and the above alternating voltage is amplified by the voltage amplifier 28 so as to output an alternating-current voltage of about ±5V to the AC to DC converter 30 through the capacitor 29 for rejecting the direct-current voltage component superimposed on the alternating-current voltage component, wherein the direct-current voltage component corresponds to a thermo-electric power caused when the superconductor is cooled ununiformly. The AC to DC converter 30 converts the alternating-current voltage into the direct-current voltage and outputs it to the A/D converter 32 through the second analogue switch 31. Then, the A/D converter 32 converts the direct-current voltage into the digital signal and outputs it to the microprocessor 36. In response to the digital signal, the microprocessor 36 calculates the variation in the resistance of the packaged sample 21 according to the predetermined calculation equation, and displays the variation in the resistance thereof with the variation in the temperature measured by the platinum film thermometer 5, as a temperature characteristic of the resistance thereof on the EL display 37 at real time as shown in FIG. 3.

According to the result shown in FIG. 3, it is observed that the resistance of the packaged sample 21 decreases gradually when the temperature thereof is decreased, and a threshold temperature of the superconductor at which the superconductor changes from the superconductive phase to the normal conductive phase is 82K.

(2) Action of the apparatus upon measuring a current characteristic of a voltage generated in the packaged sample 21

The action of the apparatus upon measuring a current characteristic of a voltage generated in the packaged sample 21 will be described below with reference to FIG. 1.

The packaged sample 21 is cooled, in the similar manner to that of the observation of the temperature characteristic of the resistance thereof, at the threshold temperature Tc or less so as to become the superconductive phase. The first analogue switch 25 is switched over so that the analogue signal outputted from the D/A converter 24 is input to the current power source 27. Then, the microprocessor 36 outputs a digital signal corresponding to a direct-current I to be supplied to the packaged sample 21, to the D/A converter 24. The D/A converter 24 converts the digital signal into an analogue direct-current voltage and outputs it to the current power source 27 through the first analogue switch 25. In response to the analogue direct-current voltage, the current power source 27 supplies a constant direct current I to the packaged sample 21. On the other hand, the voltage gain of the voltage amplifier 28 is set at about 2500, and the second analogue switch 31 is switched over so that the direct-current signal outputted from the voltage amplifier 28 is input to the A/D converter 32. Then, the voltage V generated in the packaged sample 21 is amplified by the voltage amplifier 28, and the amplified voltage is outputted to the A/D converter 32 through the second analogue switch 31. The A/D converter 32 converts the amplified direct-current voltage into a digital signal and outputs it to the microprocessor 36.

At that time, the microprocessor 36 changes data of the digital signal to be outputted to the D/A converter 24, so as to supply the direct current gradually changing in the range from zero to 150mA to the packaged sample 21, and then, the digital signal corresponding to the voltage V generated in the packaged sample 21 is input to the microprocessor 36 as described above. In response to the digital signal, the microprocessor 36 calculates the voltage V generated therein according to the predetermined calculation equation, and displays the variation in the voltage V with the variation in the current I supplied to the packaged sample 21, as a current I characteristic of a voltage V generated therein on the EL display 37 at real time as shown in FIG. 4.

According to the result shown in FIG. 4, it is observed that, when the current I supplied thereto is larger than 80 mA, the superconductor changes from the superconductive phase to the normal conductive phase so as to generate a voltage V therein, and also, the threshold current Ic thereof is about 80 mA.

(3) Action of the apparatus upon measuring a magnetic flux density characteristic of a resistance of the packaged sample 21

The action of the apparatus upon measuring a magnetic flux density characteristic of a resistance of the packaged sample 21 will be described below with reference to FIG. 1.

The packaged sample 21 is cooled in the similar manner to that of the observation of the current characteristic of the voltage thereof, at the threshold temperature Tc or less so as to become the superconductive phase. The first analogue switch 25 is switched over so that the analogue direct-current voltage outputted from the D/A converter 24 is input to the current power source 27. On the other hand, the voltage gain of the voltage amplifier 28 is set at about 1000, and the second analogue switch 31 is switched over so that the voltage outputted from the voltage amplifier 28 is input to the A/D converter 32.

The microprocessor 36 outputs a digital signal to the D/A converter 24 so that the current power source 27 supplies a direct current I of 100 mA to the packaged sample 21, in the similar manner to that of the observation of the current characteristic of the voltage thereof, and also outputs a digital signal corresponding to a magnetic flux density of a magnetic field applied to the packaged sample 21, to the D/A converter 33. The D/A converter 33 converts the digital signal into an analogue direct-current voltage and outputs it to the magnetic field generator 34. In response to the analogue direct-current voltage, the magnetic field generator 34 converts the direct-current voltage into a direct current and supplies it to the coil 35 so as to apply a magnetic field to the packaged sample 21. Then, the microprocessor 36 changes data of the digital signal so as to apply a magnetic field having a magnetic flux density changing in the range from zero gauss to 20 gauss onto the packaged sample 21.

At that time, in response to the digital signal input from the A/D converter 32, the microprocessor 36 calculates the resistance of the superconductor according to the predetermined calculation equation, and displays the variation in the resistance thereof with the variation in the magnetic flux density of the magnetic field applied thereto, as a magnetic flux density characteristic of a resistance thereof, on the EL display 37 at real time as shown in FIG. 5.

According to the result shown in FIG. 5, it is observed that, when the magnetic flux density of the magnetic field is larger than about 5 gauss, the superconductor changes from the superconductive phase to the normal conductive phase so as to have an electric resistance.

In the present preferred embodiment, a sintered body of Y-Ba-Cu oxide is used as the superconductive material of the packaged sample 21, however, the present invention is not limited to this. As the superconductor of the packaged sample 21, there may be used a superconductor which can become the superconductive phase when it is cooled by a coolant having a temperature of the threshold temperature Tc or less such as a liquefied gas. For example, a superconductive thick film of Y-Ba-Cu compounds made by a spray pyrolysis method, and a thin film of Y-Ba-Cu compounds made by a spattering method can be used as the superconductor of the packaged sample 21.

In the present preferred embodiment, the EL display 37 is used as the external display unit for displaying the measured characteristics of the packaged sample 21, however, the present invention is not limited to this. For example, the other sorts of display units such as a liquid crystal display, a plasma display, a CRT, an LED may be used as the external display unit.

SECOND PREFERRED EMBODIMENT

Figure 6:
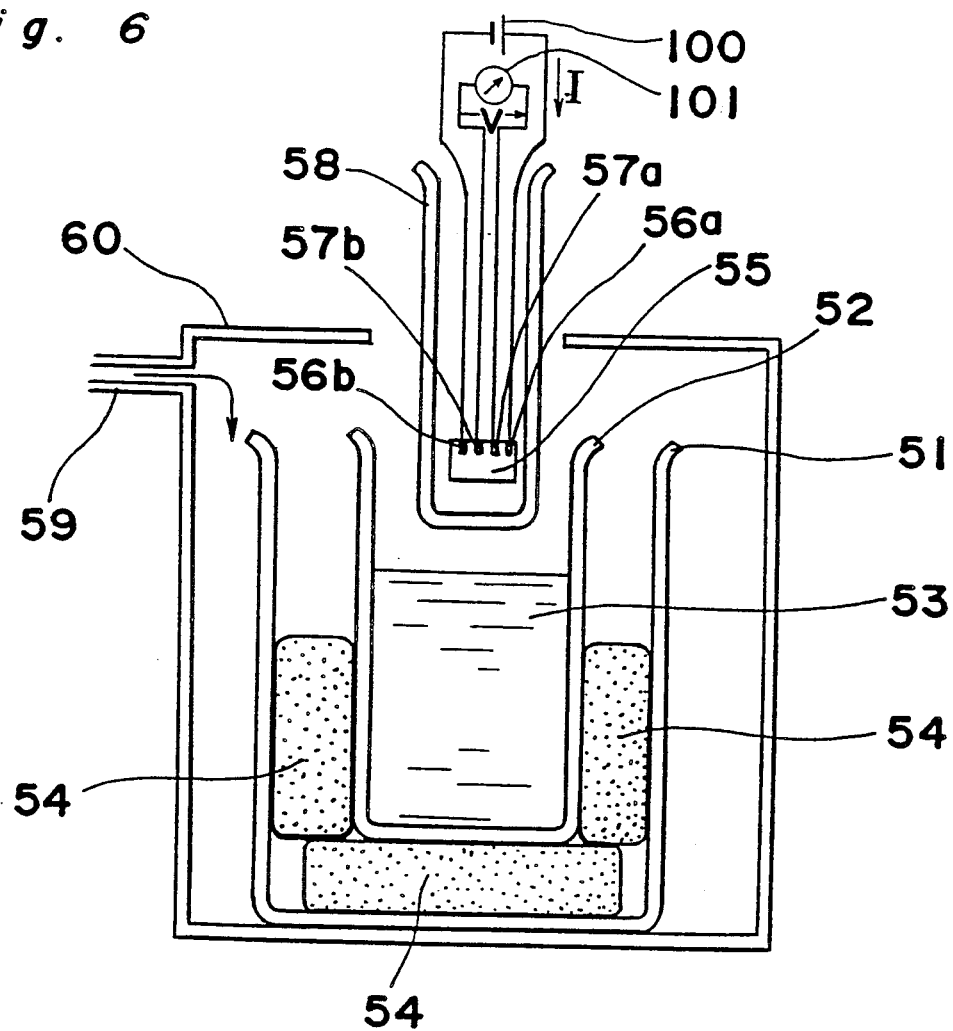
FIG. 6 is a schematic cross sectional view of an apparatus for observing a superconductive phenomenon in a superconductor of a second preferred embodiment according to the present invention.

FIG. 6 shows an apparatus for observing a superconductive phenomenon in a superconductor 55 of a second preferred embodiment according to the present invention.

On the superconductor 55, a pair of current electrodes 56a and 56b and a pair of voltage electrodes 57a and 57b are mounted. The superconductor 55 is inserted into a Pyrex ® glass tube 58 so that the superconductor 55 is apart from the bottom of the glass tube 58 by a distance of 1 cm. There are provided a container 52 of Pyrex ® transparent glass for containing liquid nitrogen 53 for cooling the superconductor 55 and a container 51 of Pyrex ® transparent glass for containing the container 52 through heat insulators 54 of foamed polystyrene. The containers 51 and 52 are inserted into a container 60 of transparent acrylic resin having an opening 59 for flowing dried nitrogen gas thereto. A pair of current electrodes 56a and 56b mounted on the superconductor 55 are connected to a current power source 100 for supplying a constant current I thereto, and a pair of voltage electrodes 57a and 57b thereof are connected to a voltmeter 101 for measuring a voltage V generated in the superconductor 55. In the present preferred embodiment, the containers 51 and 52 have volumes of 500 ml and 300 ml, respectively, and the distance between the containers 51 and 52 is 1.5 cms. The liquid nitrogen 53 of 250 ml is contained in the container 52.

Figure 7:
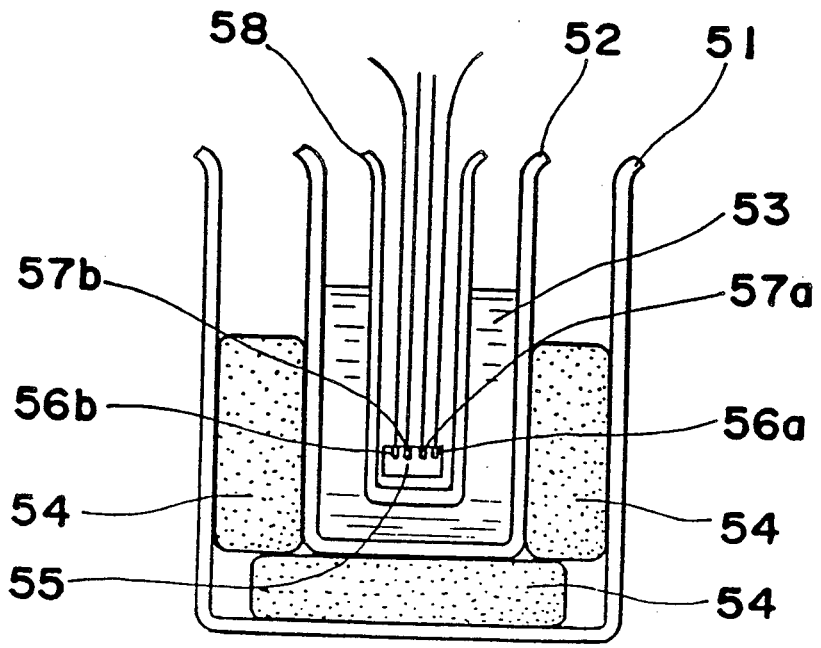
FIG. 7 is a schematic cross sectional view of the observing apparatus shown in FIG. 6 when a glass tube containing a superconductive device is immersed in liquid nitrogen.

In such a state that a constant current I of 1 mA is supplied to the current electrodes 56a and 56b mounted on the superconductor 55, the glass tube 58 into which the superconductor 55 has been inserted as described above is gradually immersed into the liquid nitrogen 53, and the glass tube 58 is set at such a state shown in FIG. 7 so that the bottom of the glass tube 58 is apart from the bottom of the container 52 by a predetermined distance.

Similarly, only the superconductor 55 is gradually immersed into the liquid nitrogen 53.

Figure 8:
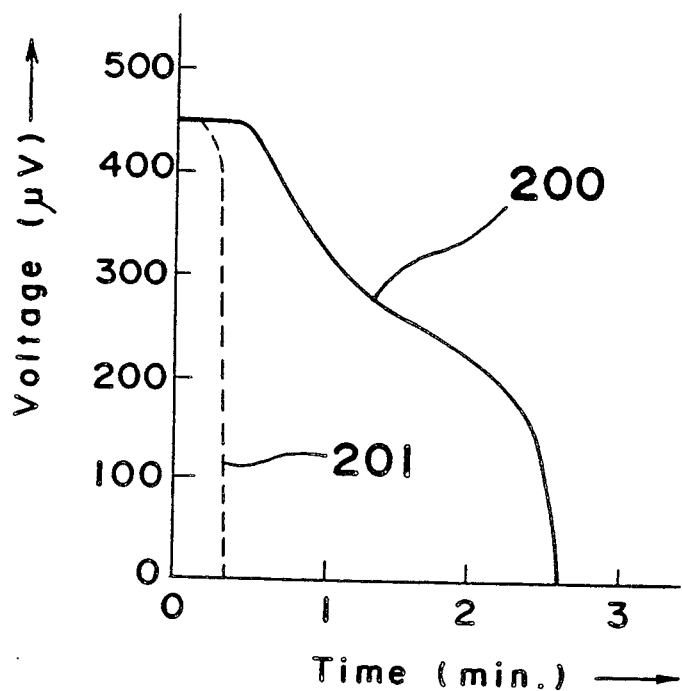
FIG. 8 is a graph showing passed time characteristics of a voltage generated in the superconductive device in the case that the superconductive device inserted into the glass tube is gradually immersed into the liquid nitrogen and in the case that only the superconductive device is gradually immersed thereinto.

FIG. 8 is a graph showing passed time characteristics of a voltage generated in the superconductor 55, wherein a real line curve 200 shows the characteristic in the case that the superconductor 55 which has been completely inserted into the glass tube 58 is gradually immersed into the liquid nitrogen 53, and a dotted line curve 201 shows the characteristic in the case that only the superconductor 55 is gradually immersed into the liquid nitrogen 53.

As is apparent from FIG. 8, when only the superconductor 55 is gradually immersed into the liquid nitrogen 53, the voltage generated therein varies steeply according to the passed time, namely, the temperature thereof varies steeply according to the passed time. On the other hand, when the superconductor 55 which has been completely inserted into the glass tube 58 is immersed into the liquid nitrogen 53, the voltage generated therein varies gradually according to the passed time, namely, the temperature thereof varies gradually according to the passed time.

THIRD PREFERRED EMBODIMENT

Figure 9:
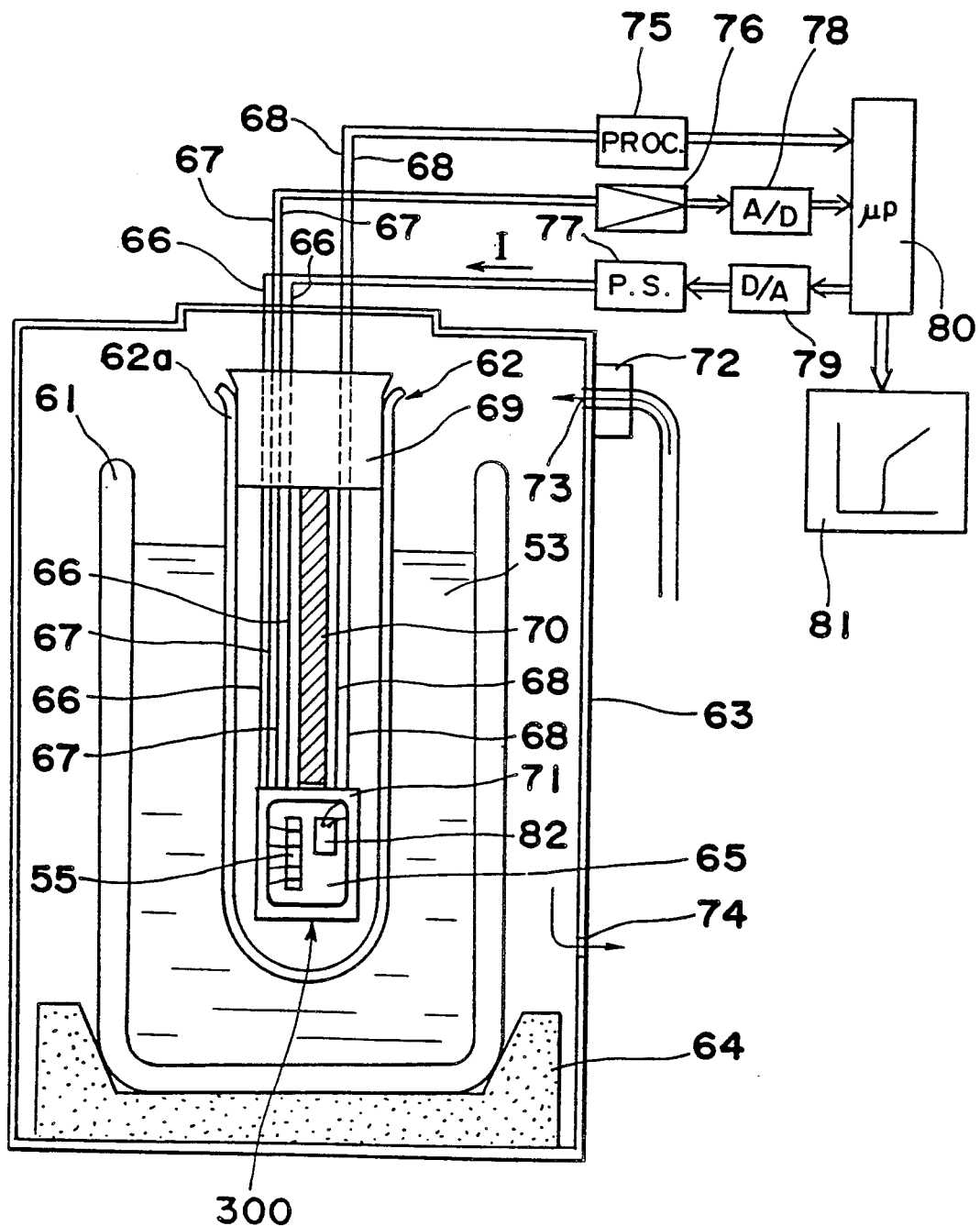
FIG. 9 is a schematic cross sectional view and a schematic block diagram of an apparatus for observing a superconductive phenomenon in a superconductor of a third preferred embodiment according to the present invention.

FIG. 9 shows an apparatus for observing a superconductive phenomenon in a superconductor 55 of a third preferred embodiment according to the present invention.

In the apparatus, there are provided a test tube 62 of Pyrex ® glass for containing the superconductor 55 to be measured, and a Dewar flask 61 of Pyrex ® glass for containing liquid nitrogen for cooling the superconductor 55 contained in the test tube 62. The Dewar flask 61 is inserted into a container 63 of transparent acrylic resin having an inflow opening 72 for making dried inactive nitrogen gas 73 flow thereinto and an outflow opening 74 for making the dried inactive nitrogen gas 73 flow out to the outside thereof, wherein the inflow opening 72 is formed at the upper portion of the side surface of the container 63 and the outflow opening 73 is formed at the lower portion thereof.

The superconductor 55 and a thermal sensor 82 are mounted on a synthetic resin container 71 so that they are close to each other, and then, the container 71 is sealed by a glass plate 65. A package 300 is comprised of the container 71 and the glass plate 65.

A silicon rubber stopper 69 is mounted on the top opening 62a of the test tube 62, and in the silicon rubber stopper 69, there are formed small openings (not shown) for passing therethrough a pair of wires 66 and a pair of wires 67 connected to the superconductor 55 and a pair of wires 68 connected to the thermal sensor 82, and an opening (not shown) for passing therethrough a glass plate 70 for bonding the package 300 thereon with use of a both sides tape so as to be fixed thereon. The Dewar flask 61 is filled with liquid nitrogen 53, and is arranged on an heat insulator 64 of foamed polystyrene which is set on the bottom of the container 63, resulting in that the Dewar flask 61 is heat-insulated from the container 63 by the heat insulator 64.

A microprocessor 80 controls the operation of the apparatus shown in FIG. 9, and outputs a digital signal corresponding to a constant current I to be supplied to the superconductor 55, to a D/A converter 79. The D/A converter 79 converts the digital signal into an analogue signal and outputs it to the current power source 77. In response to the analogue signal, the current power source 77 supplies a constant direct current I to the superconductor 55 through a pair of wires 66.

A voltage generated in the superconductor 55 is input to a voltage amplifier 76 through a pair of wires 67, and is amplified by the voltage amplifier 76, and then, the amplified voltage is outputted to an A/D converter 78. The A/D converter 78 converts the analogue voltage into a digital signal and outputs it to the microprocessor 80. Furthermore, a signal outputted from the thermal sensor 82 is input to a signal processing circuit 75 through a pair of wires 68, and the signal processing circuit 75 processes the input signal according to a predetermined signal processing and outputs temperature data to the microprocessor 80.

In response to the digital signal input from the A/D converter 78, the microprocessor 80 calculates the electric resistance of the superconductor 55 according to a predetermined calculation equation, and displays the calculated electric resistance thereof with the temperature thereof, as a temperature characteristic of an electric resistance, on a display 81.

The results obtained by measurement with use of the observing apparatus shown in FIG. 9 are as follows.

Figure 10:
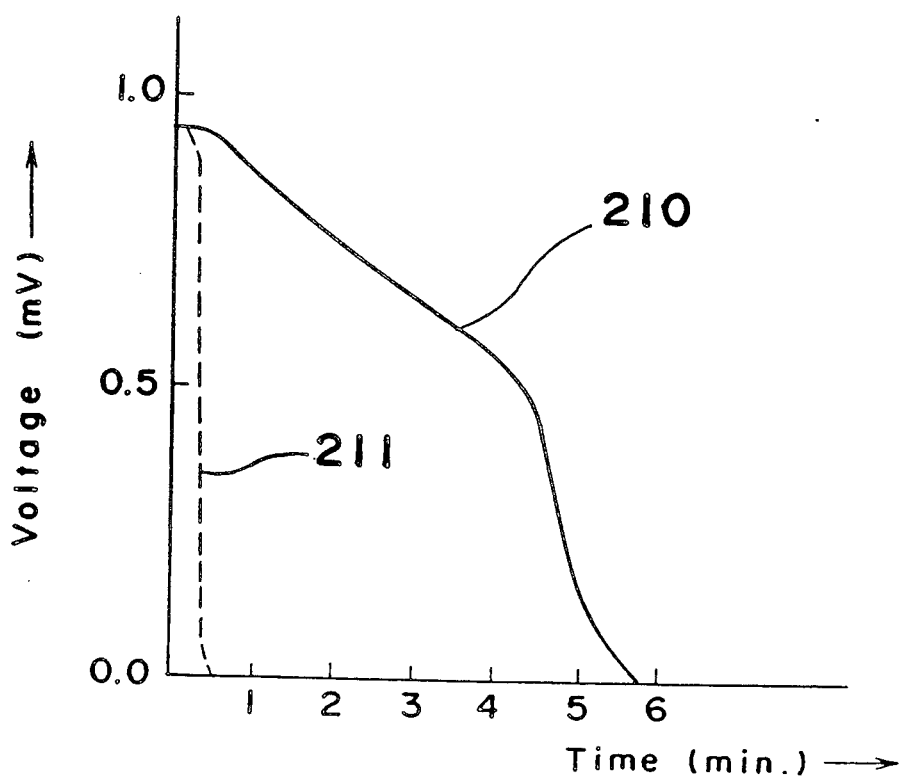
FIG. 10 is a graph showing passed time characteristics of a voltage generated in the superconductive device in the case that the superconductive device inserted into a test tube is immersed in liquid nitrogen and in that case that only the superconductive device is immersed therein.
Figure 11:
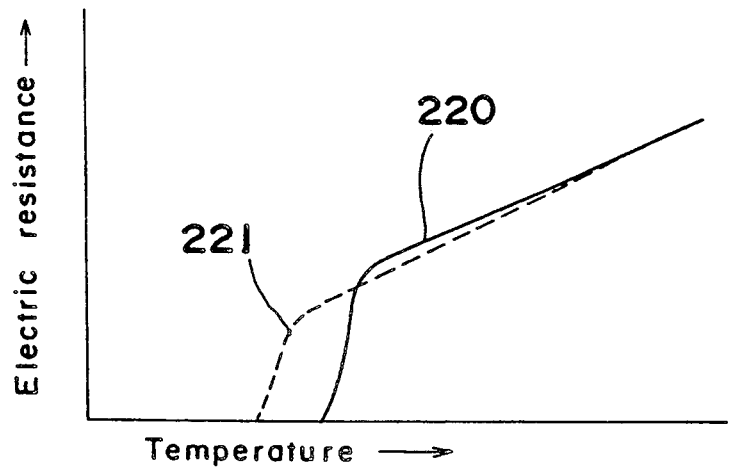
FIG. 11 is a graph showing temperature characteristics of an electric resistance of the superconductive device in the case that the superconductive device inserted into a test tube is immersed in liquid nitrogen and in that case, that only the superconductive device is immersed therein.

A real line curve 210 of FIG. 10 shows a passed time characteristic of a voltage generated in the superconductor 55 when the test tube 62 containing the superconductor 55 is immersed in the liquid nitrogen 53 for about 15 seconds at such a state that a constant current of 3 mA is supplied thereto, and a real line curve 220 of FIG. 11 shows a temperature characteristic of an electric resistance thereof to be shown on the display 81 in this case.

A dotted line curve 211 of FIG. 10 shows a passed time characteristic of a voltage generated in the superconductor 55 when the superconductor 55 contained within the package 300 is immersed in the liquid nitrogen 53 for about 15 seconds in the similar manner after removing the test tube 62 shown in FIG. 9, and a dotted line curve 221 of FIG. 11 shows a temperature characteristic of an electric resistance thereof to be shown on the display 81 in this case.

According to the results shown in FIGS. 10 and 11, the temperature of the package 300 shown in FIG. 9 varies steeply when the glass test tube 62 has been removed, and therefore, the difference between respective temperatures of the superconductor 55 and the thermal sensor 82 is relatively large. It is understood that the superconductive material 55 does not become a thermal equilibrium state.

As is apparent from the above experiment, when the package 300 containing the superconductor 55 is not contained in the glass test tube 62 and the package 300 is directly immersed in the liquid nitrogen 53, the temperature of the superconductor 55 decreases steeply. On the other hand, when the package 300 is contained in the glass test tube 62 and the test tube 62 containing the superconductor 55 is immersed in the liquid nitrogen 53, the temperature of the superconductor 55 decreases gradually, resulting in that the temperature characteristic of the electric resistance of the superconductor 55 can be measured accurately.

Furthermore, since the dried nitrogen gas 23 is flowed into the container 63, frost is prevented from adhering to the containers 61 and 63, and the superconductor 55 can be observed clearly upon measuring the characteristics thereof.

Furthermore, since moisture can be prevented from being collected on the containers 61 and 63 and frost can be prevented from adhering to the containers 61 and 63, the superconductor 55 can be observed clearly for a long time.

FOURTH PREFERRED EMBODIMENT

Figure 12:
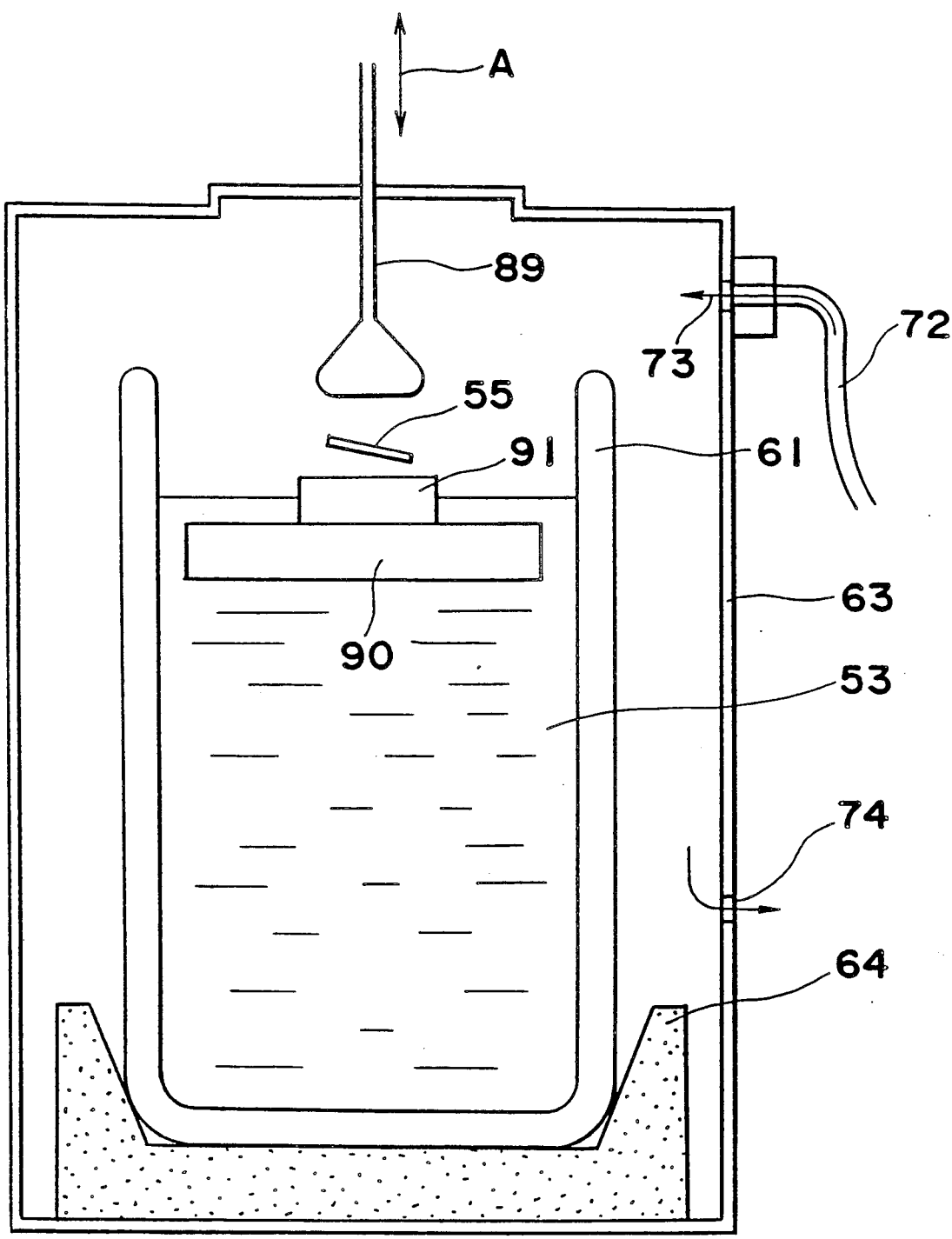
FIG. 12 is a schematic cross sectional view of a superconductive phenomenon observing apparatus for causing the Meissner effect of a fourth preferred embodiment according to the present invention.

FIG. 12 shows a superconductive phenomenon observing apparatus for causing the Meissner effect of a fourth preferred embodiment according to the present invention.

A permanent magnet 91 for floating the superconductor 55 in air is mounted on a plate-shaped foamed polystyrene material 90 for floating the permanent magnet 91 midway in the liquid nitrogen 53 filled in the container 61. The container 61 is inserted into the container 63 in the similar manner to that of the third preferred embodiment.

After immersing the superconductor 55 into the liquid nitrogen 53 once with use of a glass stick 89 so that the superconductor 55 becomes the superconductive phase, the glass stick 89 is removed therefrom. Then, a reaction force is caused between the superconductor 55 and the permanent magnet 91 by the Meissner effect, and the superconductor 55 is floated in air above the permanent magnet 91.

In the superconductive phenomenon observing apparatus for causing the Meissner effect, upon inserting the glass stick 89 into the container 63 or upon further putting the liquid nitrogen thereinto, moisture is collected on the container 63 and frost adheres thereto. In this case, moisture can be prevented from being collected on the container 63 and frost can be prevented from adhering thereto by flowing the dried nitrogen gas into the containers 61 and 63.

FIGS. 13a to 13d show a method for measuring a light transmittance of visible light according to the present invention, and the measurement thereof is performed on a measurement condition of a temperature of 25° C. and a relative humidity of 60%.

Figure 13A:
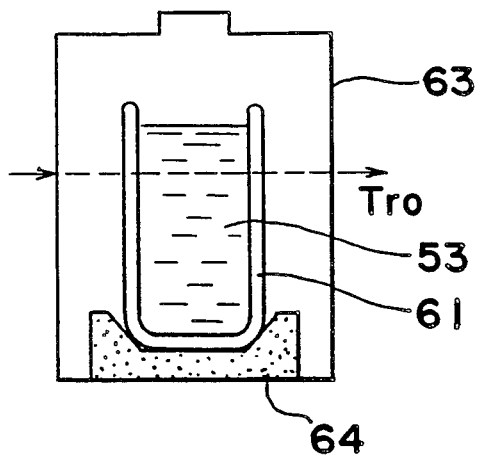
FIGS. 13a to 13d are schematic cross sectional views showing a method for measuring a light transmittance of visible light according to the present invention.

FIG. 13a shows a method for measuring a light transmittance Tr0 immediately after putting the liquid nitrogen into the Dewar flask 61.

Figure 13B:
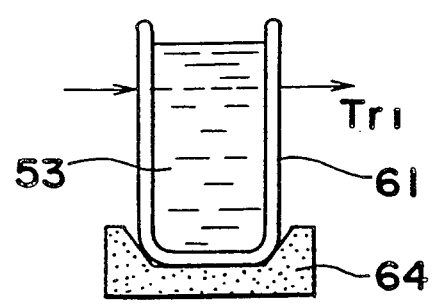

FIG. 13b shows a method for measuring a light transmittance Tr1 when the Dewar flask 61 is not contained in the container 63.

Figure 13C:
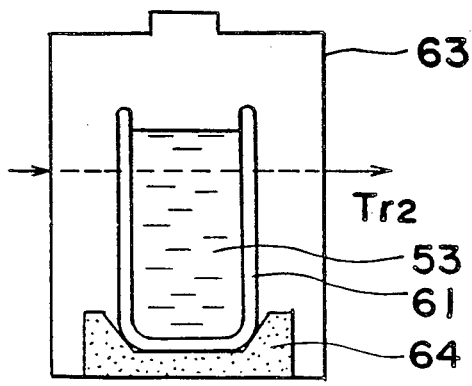

FIG. 13c shows a method for measuring a light transmittance Tr2 when the Dewar flask 61 is contained in the container 63.

Figure 13D:
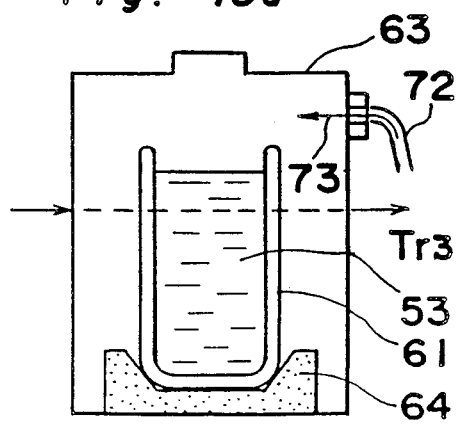

FIG. 13d shows a method for measuring a light transmittance Tr3 when the dried nitrogen gas is flowed into the container 63 at a flowing speed of 200 ml/min..

Figure 14:
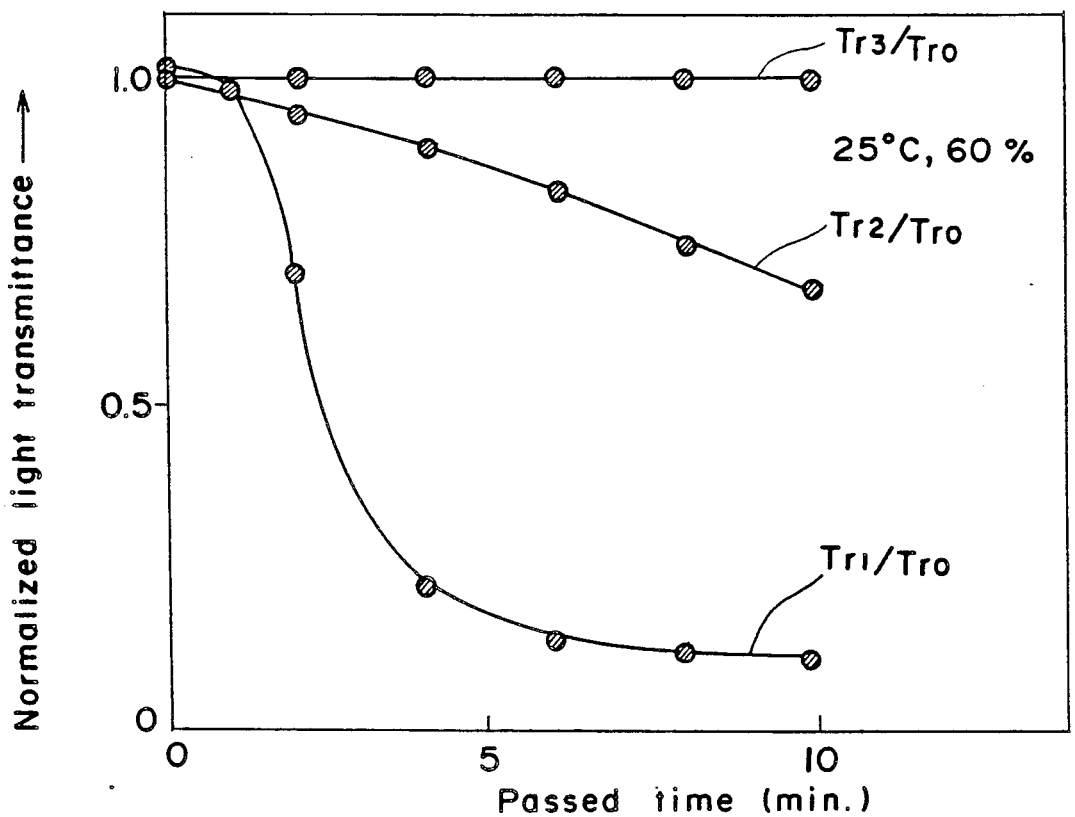
FIG. 14 is a graph showing ratios Tr1/Tr0, Tr2/Tr0 and Tr1/Tr0 of the light transmittance immediately after putting liquid nitrogen into a Dewar flask, to the light transmittance when a certain time has been passed after putting it thereinto.

FIG. 14 is a graph showing the ratios Tr1/Tr0, Tr2/Tr0 and Tr3/Tr0 of the light transmittance immediately after putting the liquid nitrogen 53 into the Dewar flask 61 to the light transmittance when a certain time has been passed after putting it thereto.

As shown in FIG. 14, when the Dewar flask 61 is not contained in the container 63, the ratio Tr1/Tr0 decreases steeply 2 or 4 minutes after putting the liquid nitrogen 53 into the Dewar flask 61, and moisture is collected on the Dewar flask 61, resulting in that a state of the inside of the container 63 can not be seen almost.

When the Dewar flask 61 is contained in the container 63 and the dried nitrogen gas is not flowed into the container 63, the ratio Tr2/Tr0 decreases gradually, and moisture starts to be collected on the Dewar flask 61. After time of 8 or 10 minutes has been passed, it becomes very difficult to see the state of the inside of the container 63.

On the other hand, when the Dewar flask 61 is contained in the container 63 and the dried nitrogen gas is flowed into the container 63, the ratio Tr3/Tr0 does not vary almost even after time of 10 minutes has been passed. Namely, the state of the inside of the container 63 can be seen clearly.

Figure 15:
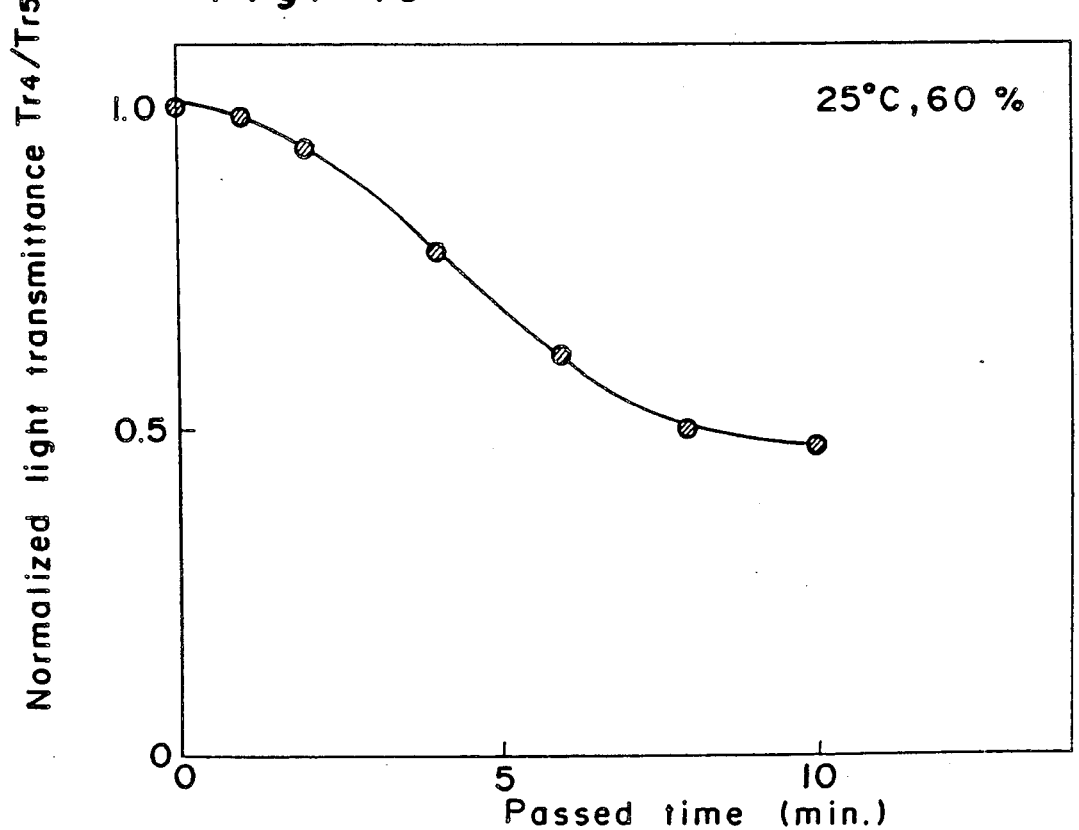
FIG. 15 is a graph showing a ratio Tr4/Tr5 of a light transmittance Tr4 to a light transmittance Tr5, wherein the light transmittance Tr4 is measured when an upper cover of a container is closed again after the upper cover is opened for one minute at such a state that a Dewar flask is sufficiently cooled as shown in FIG. 13d, and the light transmittance Tr5 is measured when dried nitrogen gas is flowed into a container.

FIG. 15 is a graph showing a ratio Tr4/Tr5 of a light transmittance Tr4 to a light transmittance Tr5 with a passed time after closing an upper cover of a container, wherein the light transmittance Tr4 is measured in the case that the upper cover of the container 63 is opened for one minute at such a state that the Dewar flask 61 is sufficiently cooled as shown in FIG. 13d, and thereafter, the upper cover is closed again and dried nitrogen gas is not flowed into the container 61, and the light transmittance Tr5 is measured when the dried nitrogen gas is flowed into the container 63 at a flowing speed of 400 ml/min..

As is apparent from FIGS. 14 and 15, the light transmittance when the dried nitrogen gas starts to be flowed into the container 63 after time of about two minutes has been passed is larger than the light transmittance when the dried nitrogen gas is not flowed into the container 63.

It is understood that various other modifications will be apparent to and can be readily made by those skilled in the art without departing from the scope and spirit of the present invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which the present invention pertains.

What is claimed is:

1. An apparatus for observing a superconductive phenomenon, comprising:
   a first transparent container for containing a superconductor and a coolant for cooling said superconductor;
   a second transparent container for containing said first transparent container in an airtight state;
   means for introducing a dried inert gas into the inside of said second transparent container, said dried inert gas being kept at a pressure higher than the pressure outside of said second transparent container,
   said dried inert gas preventing frost from adhering to said first and second transparent containers; and
   heat-insulating means for heat-insulating and supporting said first transparent container from the said second transparent container, said heat-insulating means contacting the outside of said first transparent container and the inside of said second transparent container.

2. The apparatus as claimed in claim 1, further comprising a third transparent container for containing said superconductor so that said superconductor is cooled separately from said coolant.

3. The apparatus as claimed in claim 1, further comprising a permanent magnet for floating said superconductor by the Meissner effect, said superconductor having been cooled at a threshold temperature at which said superconductor changes from the normal conductive phase to the superconductive phase, said permanent magnet contained in said first transparent container.

4. The apparatus as claimed in claim 3, further comprising means for floating said permanent magnet in said coolant.

5. The apparatus as claimed in claim 2, further comprising a permanent magnet for floating said superconductor by the Meissner effect, said superconductor having been cooled at a threshold temperature at which said superconductor changes form the normal conductive phase to the superconductive phase, said permanent magnet being container in said first transparent container.

6. The apparatus as claimed in claim 9, further comprising means for floating said permanent magnet in said coolant.

7. The apparatus as claimed in claim 1, wherein said dried inert gas is nitrogen.

* * * * *